(12) United States Patent
Zarnowski et al.

(10) Patent No.: US 7,518,646 B2
(45) Date of Patent: **\*Apr. 14, 2009**

(54) IMAGE SENSOR ADC AND CDS PER COLUMN

(75) Inventors: Jeffrey J. Zarnowski, McGraw, NY (US); Ketan V. Karia, Cortland, NY (US); Thomas Poonnen, Cortland, NY (US)

(73) Assignee: Panavision Imaging LLC, Homer, NY (US)

( * ) Notice: Subject to any disclaimer, the term of this patent is extended or adjusted under 35 U.S.C. 154(b) by 517 days.

This patent is subject to a terminal disclaimer.

(21) Appl. No.: 11/230,385

(22) Filed: Sep. 20, 2005

(65) Prior Publication Data

US 2006/0012696 A1    Jan. 19, 2006

Related U.S. Application Data

(63) Continuation-in-part of application No. 10/106,399, filed on Mar. 25, 2002, now Pat. No. 6,965,407.

(60) Provisional application No. 60/278,639, filed on Mar. 26, 2001.

(51) Int. Cl.
*H04N 3/14*   (2006.01)
*H04N 5/335*  (2006.01)

(52) U.S. Cl. .................. 348/302; 348/294; 250/208.1

(58) Field of Classification Search .............. 348/302, 348/298

See application file for complete search history.

(56) References Cited

U.S. PATENT DOCUMENTS

| | | | | |
|---|---|---|---|---|
| 5,841,126 A | * | 11/1998 | Fossum et al. | 250/208.1 |
| 5,877,715 A | * | 3/1999 | Gowda et al. | 341/122 |
| 6,633,335 B1 | * | 10/2003 | Kwon et al. | 348/308 |
| 6,703,959 B2 | * | 3/2004 | Kuwabara | 341/155 |
| 6,867,804 B1 | * | 3/2005 | Kim et al. | 348/294 |

\* cited by examiner

*Primary Examiner*—Sinh N Tran
*Assistant Examiner*—Hung H Lam
(74) *Attorney, Agent, or Firm*—Bernhard P. Molldrem, Jr.

(57) ABSTRACT

A solid state imager converts analog pixel values to digital form on an arrayed per-column basis. An N-bit counter supplies an N-bit DAC to produce an analog ramp output with a level that varies corresponding to the contents of the counter. A ripple counter or equivalent is associated with each respective column. A clock supplies clock signals to the counter elements. A comparator in each column gates the counter element when the analog ramp equals the pixel value for that column. The contents of the counters are transferred sequentially to a video output bus to produce the digital video signal. Additional black-level readout counter elements can create and store a digital value that corresponds to a dark or black video level. A subtraction element subtracts the black level value from the pixel value to reduce fixed pattern noise. An additional array of buffer counter/latches can be employed. The ripple counters can be configured as counters to capture the digital video level, and then as shift registers to clock out the video levels to an output bus. The clock pulses for the DAC counter and for the ripple counters can be at the same or different rates.

15 Claims, 13 Drawing Sheets

SAMPLE-AND-HOLD

READOUT_CLOCK

FIG.4A SAMPLE-AND-HOLD

FIG.4B READOUT_CLOCK

FIG.4D RESET_PEAK

FIG.6A SAMPLE-AND-HOLD

FIG.6B READOUT_CLOCK

FIG.6E TRANSFER

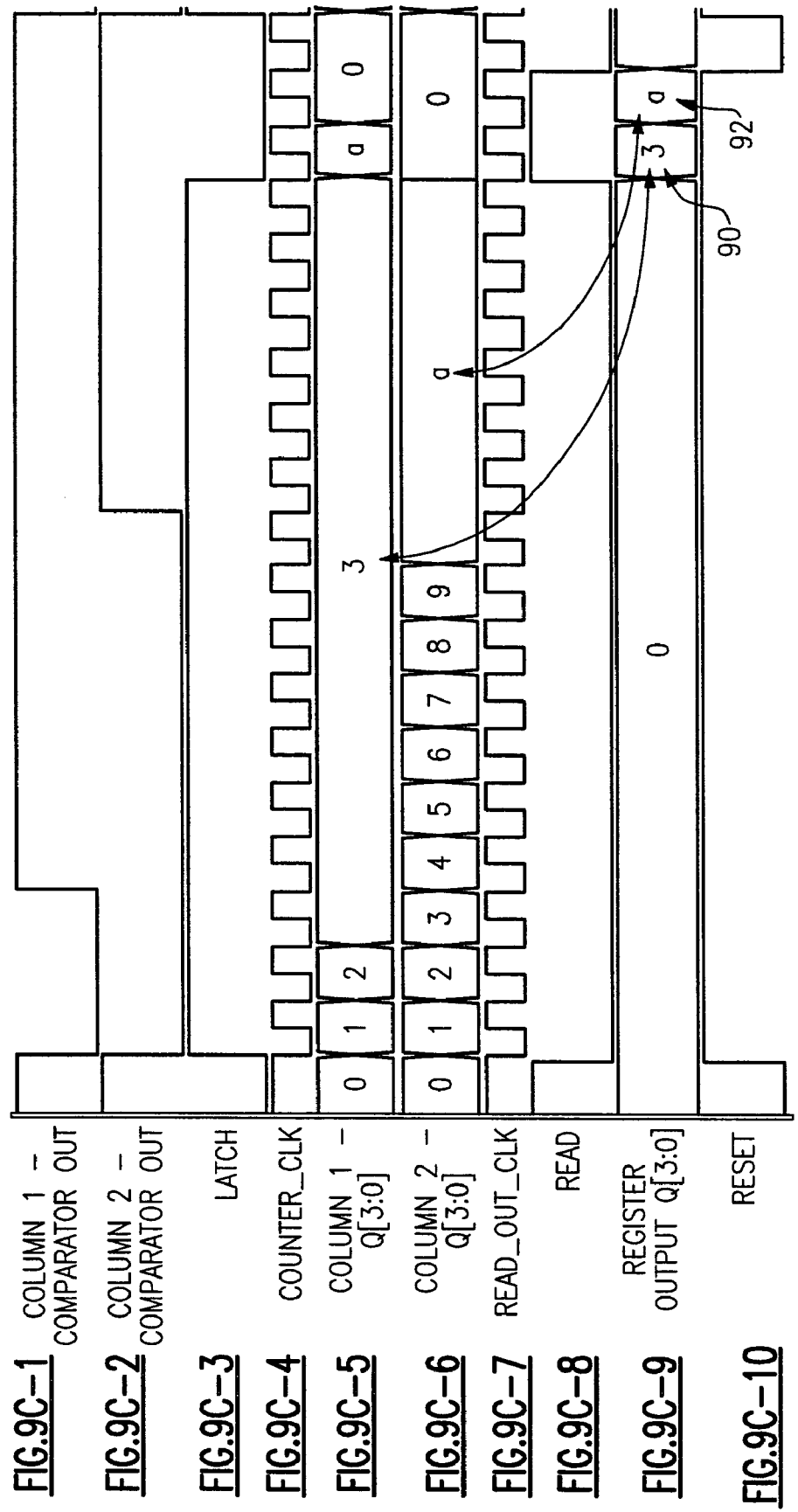

IMAGE SENSOR ADC AND CDS PER COLUMN

This is a Continuation-in-Part of earlier commonly assigned U.S. patent application Ser. No. 10/106,399, filed Mar. 25, 2002, now U.S. Pat. No. 6,965,407, which claims priority of Provisional Application Ser. No. 60/278,639, Mar. 26, 2001, now abandoned.

BACKGROUND OF THE INVENTION

This invention relates to solid state imaging devices, and is more specifically directed to an imager that converts analog pixel values to corresponding digital values on an arrayed basis, with significantly reduced circuitry. The invention is also concerned with compensation of errors that may be present in conversion, as well as correction for offset errors attributable to the pixel photo sensor areas or to the pixel amplifiers.

DESCRIPTION OF THE PRIOR ART

The term "array" used herein refers to any kind of repeatable circuit and covers for instance a circuit per column or a circuit per row in an area (two-dimensional) sensor, or an entire line in a linear sensor (theoretically a one-pixel by N-pixel area sensor). Alternatively the term "array" could embrace every pixel in an image sensor.

A dominant factor in integrated circuit design is the silicon area utilized for a given circuit implementation and thus good circuit design requires minimizing the size of any circuit as much as possible. Any kind of arrayed circuit is a major contributor to the overall utilized silicon area, so for large arrays it is advantageous to reduce the amount of arrayed circuit. There is continuing higher demand for solid state imagers with a reduced power consumption, increased read-out speeds, smaller line intervals, higher sensitivity in the pixel amplifiers, lower FPN (fixed pattern noise), higher signal to noise ratios (SNR) and denser pixel- (and thus array-) pitches.

The majority of the present-day image sensors designs employ one or more analog bus(ses) in order to sequentially scan the signals stored in a very large array. Wide-bus analog multiplexing has significant problems due, for example, to highly capacitive loads, long settling times, voltage droop across the bus, noise cross coupling from neighboring circuits. At the same time, the highly capacitive bus is driven by a circuit with an analog supply that will suffer from the sudden surge in analog current while changing the voltage on the bus to the newly selected pixel. That surge in the analog current can inject a significant amount of noise to the highly sensitive pixel site or pixel amplifier voltage storage nodes. Finally, if the arrayed analog buffer has to be able to drive the capacitive bus (even at moderate speeds) it will need a higher quiescent supply current in the output stage and that current gets multiplied by the number of arrayed elements to yield a very high undesired power consumption for the entire array.

If A/D-converter digitizing could be implemented per arrayed circuit, the video bus multiplexing can be done in the digital domain with sharply improved noise immunity, as compared to an analog bus. There are many other advantages inherent in a digital video multiplexer as opposed to an analog video multiplexer; for example, digital logic has significantly smaller transistors, with no quiescent power consumption; there are no mismatch issues which might lead to added fixed pattern noise (FPN); and digital circuits provide excellent capacitive driving capability and an additional ability to do pipelining for increased speed.

A serious problem for analog arrayed circuits is that any mismatch between the devices will appear as fixed pattern noise (i.e., offset variations from one circuit in the array to the next). As the pixel pitch decreases the analog array pitch decreases as well, because any asymmetry in the array will show up as FPN. As the analog array pitch decreases it becomes difficult or impossible to achieve proper device matching by the usual technique making large devices, placing them in proximity and utilize dummy devices in order to make dependant devices similar in their electric parameters. This problem, however, would be absent in digital implementations.

Gain variations in CMOS and other solid-state analog imaging devices are virtually eliminated using an Active Column Sensor (ACS) approach (See U.S. Pat. No. 6,084,229, Jul. 4, 2000). Offset errors are cancelled out from the arrayed devices using a correlated double sampling (CDS) technique, where the pixel reset (black-level voltage) is subtracted from the sampled video voltage. Any common-mode errors present within the arrayed circuits are thus compensated. Conventional CMOS imagers do not use true CDS, in which the reset voltage is sampled before exposure and is subtracted from the video signal sampled after the exposure. Instead a DS (double sampling) is used, where the video signal is sampled after exposure, the pixel is reset and the reset voltage is then sampled and subtracted from the sampled video signal. True CDS eliminates the thermal or temporal (kTC) noise arising from resetting the pixel and also eliminates offset errors in the amplifiers and pixels. DS eliminates offset errors but also introduces $\sqrt{2}$ times more kTC noise (rms). Straightforward DS is often justified economically, in practical implementations, because offset errors which appear as FPN are more degrading to the perception of a scanned image than the randomized kTC noise.

Prior arrayed AD-converters typically employ a Successive Approximation Register (SAR) technique, that uses a bisectional search algorithm to find the digital pixel value (see, e.g. U.S. Pat. No. 4,978,958). An N-bit SAR Analog-to-Digital Converter (ADC) is for instance constructed from an N-bit Analog-to-Digital Converter (DAC), or similar device, a comparator, a controller and one or more N-bit registers per arrayed element. Thus the SAR ADC suffers deficiencies with respect to size, accuracy and power consumption. An N-bit SAR ADC can digitize to an analog signal in $2^N$ clock cycles compared to an N-bit Flash or pipelined flash that digitizes the signal in one or a few clock cycle(s). These clock cycles add to the line-period when digitizing the signal before read-out.

An objective of this invention over, for instance the ADC of U.S. Pat. No. 3,683,369 is to achieve a particular benefit over arrayed AD-converters by minimizing the number of arrayed analog devices needed. Also, that the analog ramp in this invention is generated by a non-arrayed DAC with the input to the DAC being a digital count, rather than the less accurate method of relying on the time from the start of an analog generated ramp and until the ramp has passed the analog input voltage.

An attempt to minimize the power and size of arrayed ADCs over conventional SARs is discussed in U.S. Pat. No. 5,880,691, where the DAC is made from various sized capacitors and was intended to achieve a significant reduction in power consumption. However, this is still an SAR design, and consumes much of the available device area.

U.S. Pat. No. 3,961,325 discusses advantages of arrayed AD-converters by using a ramp to feed an array of single comparators, but is focused on means of controlling an analog generated ramp so that it is in sync with a binary counter. Unlike the present invention, The ADC of the prior patent cannot rely on a single DAC to generate the ramp from a single counter, and cannot have the very same counter value latched throughout in all the array circuits as the digitized values. This synchronization is a serious problem, whereas proper synchronization is a given in this invention. Furthermore, the prior ADC circuits fail to address the problem of offset errors or FPN. With the prior techniques, it is difficult to reduce the size of the analog portions of the digitizing circuitry. However, in this invention, the analog part of the arrayed circuits can be made as small as possible with higher offset error variations allowed, and the absence of properly matched analog devices in the array ceases to be a problem.

OBJECTS AND SUMMARY OF THE INVENTION

Accordingly, it is an object of the present invention to provide a straightforward technique for converting the video pixel signals from a solid state imaging device to a digital video signal, and to achieve the same effect on-chip with an array that consumes a minimum of available area, and which avoids drawbacks of the prior art.

It is another object to provide a solid state imager with an arrayed ADC functionality, and which also compensates for offsets and eliminates or reduces FPN.

Another object is to improve the signal to noise ratio (SNR) of sampled signals, by providing a simple means for oversampling the signal using a simple counter for each column to develop and store the digital value corresponding to the column pixel value.

According to a preferred embodiment of this invention, an ADC arrangement converts analog pixel values from an array of pixels to a digital video signal. The array is formed, for example, of a plurality of columns and at least one row, with each column having at one pixel, and with each column having a column amplifier that provides a respective pixel value. In the ADC arrangement there is an N-bit counter; an N-bit DAC connected to the counter output, with the DAC has a ramp output providing a signal proportional to a count existing on said counter. A plurality of simple counters, i.e., asynchronous counters or ripple counters, are each associated with a respective column. A plurality of comparators are each associated with a respective one of the column amplifiers, and have one input connected to the respective column amplifier, another input connected to the ramp output of the N-bit counter, and a comparator output. The comparator output and the clock signal are applied to inputs of a logic element, e.g., a NOR or a NAND, and this supplies clocking signals to a clock input terminal of the respective ripple counter. The ripple counter continues to count up (or down) until the comparator senses that the ramp voltage equals the video level of the column amplifier. A video readout bus follows these ripple counters/latch elements, and a switch array or other equivalent means selectively transfer the contents of the ripple counters to a video output bus to produce the digital video signal. In this invention, each signal in the array is compared with a common ramp, and the comparator output is used to stop the counters at a digital count value that corresponds to that ramp level when it equals the video signal of that column. Bringing a video readout into the digital domain presents a myriad of advantages such as higher speed, lower noise and lower power. The invention also presents a variety of digital readout schemes with different speed/size tradeoffs and means to do DS and even true CDS in the digital domain to compensate for offset variations in the array. Compensation for offset errors can be easily achieved, including errors that arise from the conversion in addition to offsets between pixel amplifiers.

The ADC arrangement can compensate for FPN. To this end, a plurality of black-level readout column counters/latch elements are each associated with a respective one of the columns. Each black level readout counter/latch element may have a clock input terminal connected to the respective comparator output. The count on this black-level column counter/latch element may be applied to a black-level readout bus, and associated circuitry transfers the contents of the respective black-level counters/latch elements to the black-level readout bus simultaneously with the transfer of the contents of the first-mentioned counters to the video readout bus. A subtraction element connected to the video readout bus and the black-level readout bus then subtracts the black-level values, to eliminate offset as between the column amplifiers. In a preferred mode, the counters/latch elements may each include a first counter arrangement having an input connected to the comparator, and a second, buffer counter arrangement, with an input connected to an output of the respective first counter arrangement, a gate terminal, and an output connected to the video readout bus. In this case the buffer counter is electronically reconfigured from a counter to a latch in order to transfer the digital video output. Alternatively, the counter arrangement may be configured to count in one direction to reach a value corresponding to the black offset value, and then count in the other direction to reach a value corresponding to the column video level, so as to automatically compensate for any variation in black offset from one column to another. The counter per column configuration would involve selectable up/down counters.

The column counters can be used for re-sampling or oversampling of the image during a video readout phase. Each counter would require an additional number of bits equal to the log(base 2) of the number of oversamplings. That is, for a 12-bit sample per column, if each signal is sampled twice per video readout, then the counter would require 13-bit capacity, for four oversamplings the counter would require 14-bit capacity, etc. For example, if each sampling could have a value from zero to 4095, and the counter is used to count up to 4096 possible values twice, there is a need to store up to a total of 8191. The counter would hold the total of the two sample values, and a choice can be made to use the stored value as gain or as noise reduction. The asynchronous counter stores the value as a binary value, and if a whole binary oversampling is used, the number of times each column is sampled would be 2, 4, 8, 16, etc., and no further mathematical operation is needed to divide the count back down to the 12-bit level. Only the upper 12 bits are used, and the lowest two bits are not read out. This in effect is a divide-by-two (or divide-by-four, etc.) operation. Alternatively, for low light level operation, the twelve least significant bits can be read out following oversampling.

The oversampling for gain or noise reduction for each pixel of a selected row can also be done for two or more rows on the same counter, thereby summing up the video level for two different rows. This allows for digital summing of pixels in two or more different rows and allowing for gain and noise reduction with oversampling. There is a trade-off in terms of lower resolution if the pixels are not readout between summing the two rows, but this is frequently outweighed in terms of user benefit, namely, greater dynamic range. In some applications, such as those where the imager resolution exceeds the display capabilities available to the user, there will be no loss of displayed resolution and enhanced dynamic range, and the field of view will remain that of the entire imager. This is advantageous in many applications, as unwanted pixels are removed to fit the display capabilities. With this capability to sum pixels, few or no pixels will be removed to fit the display. With the ability to sum different rows on the imager and with the ability of CMOS/MOS imagers to address and reset pixels in any sequence, very different integration times can be applied to the various rows selected, providing the capability of still further enhancement of dynamic range. For example in scenes where there are very bright regions, such as car head lights, some of the pixels can quickly become saturated and detail is lost. If two different rows, and usually adjacent rows, are given different integration times, i.e., one row having a very short integration time and another row having a typical integration time, the two rows can be summed and still have detail which would have been lost with pixel saturation. The term adjacent, as used here, can depend upon the application and the type of color filters arrangement employed. For a Bayer color arrangement the adjacent pixels for pixels with red filters, for example, are actually two rows apart for the same column. For striped color filter arrangements, the adjacent pixels would usually be physically touching each other. In effect, the slope of the DAC output ramp can be programmed so that the slope is different for different rows of pixels.

Also, as the digital-analog converter or DAC is often programmable, the user can change the ramp gains between reads of the same row or between different rows to match color sensitivities or enhance the DAC ramp range for low and high light level images. The imager can generate one ramp or two or more ramps in parallel. This can use multiple DACs or a single programmable DAC. If multiple ramps are needed by the application, ramp gain adjustment for pixels of different colors filters, but where application size and power limitations permit only a single DAC, then DAC ramp output can be split into two or more ramps in parallel. This can involve buffering the ramp signal with different gains that can be separately programmable if need be. The buffering can be accomplished with simple programmable source follower circuits or programmable operational amplifiers.

In another embodiment, the counter architecture permits an array of flip-flops, i.e., a DFF array, as ripple counters during pixel sampling, and then as shift registers to clock out the stored data in sequence, i.e., as a sequential digital output bus.

The use of flip flops configured as ripple counters permits the processing circuitry of the digital imager to be constructed as simply as possible with a minimum of active elements and a minimum of metalized conductors, thus occupying as small an area of semiconductor material as possible.

The above and many other objects, features, and advantages of this invention can be achieved and will become apparent from a consideration of the following description of selected preferred embodiments, which are to be read in connection with the accompanying Drawing.

BRIEF DESCRIPTION OF THE DRAWING

FIGS. 4A to 4G are signal charts for explaining the operation of this embodiment.

FIGS. 6A to 6F are signal charts for explaining the operation of this embodiment.

FIG. 9C-1 to FIG. 9C-10 are signal diagrams for explaining the operation of the counter/latch elements as shown in FIGS. 9A and 9B.

FIG. 10 and FIG. 11 are charts for explaining non-linear implementations of this invention.

DETAILED DESCRIPTION OF THE PREFERRED EMBODIMENTS

Figure 1:
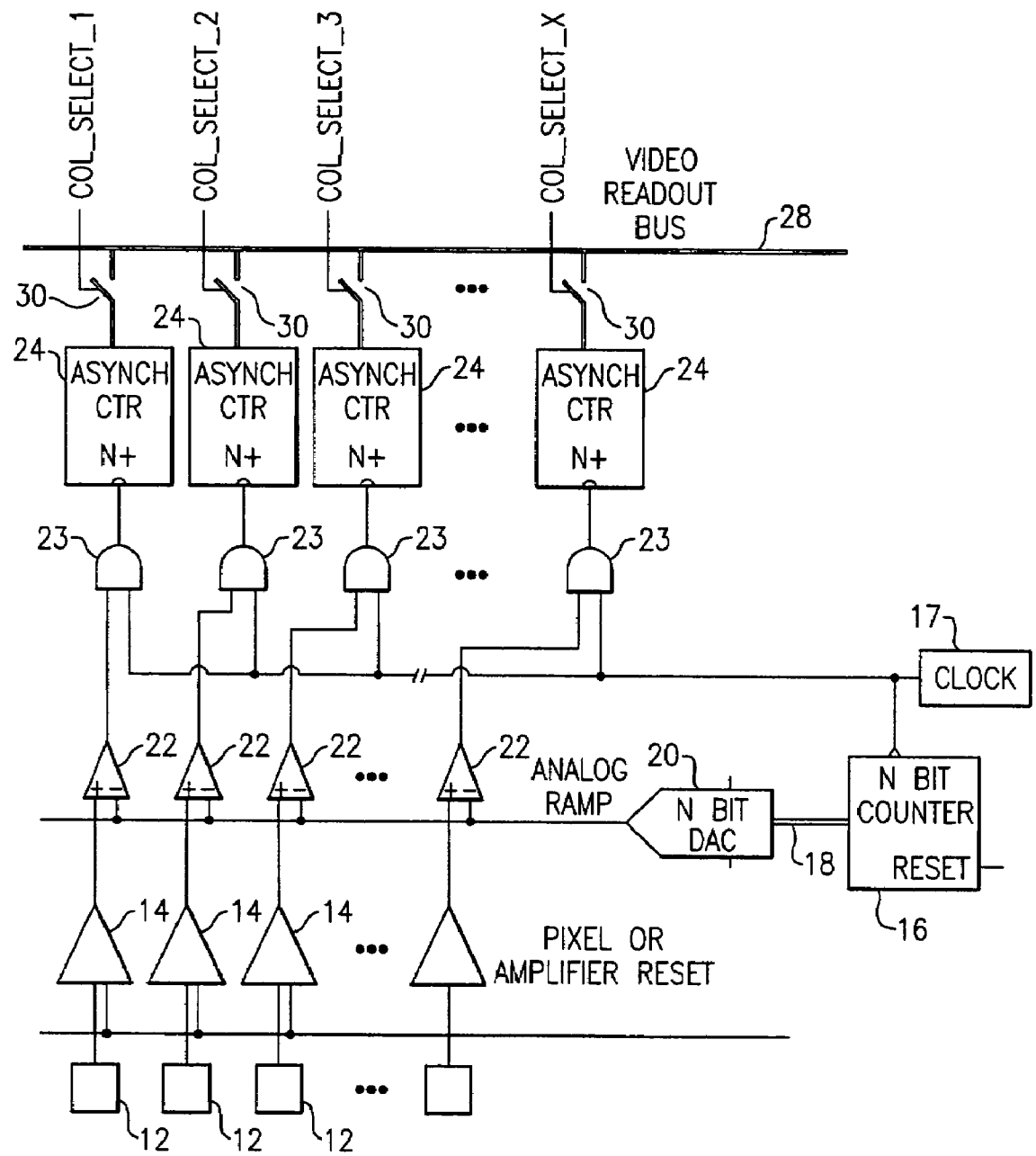
FIG. 1 is a schematic circuit diagram of a solid state imager employing an arrayed ADC according to one preferred embodiment of this invention.

With reference to the Drawing figures, and initially to FIG. 1 thereof, an arrayed solid-state imager 10 is shown, which incorporates an N-bit ADC conversion facility that employs an N-bit counter and a DAC to generate an analog ramp.

In this imager 10, there are multiple columns, each comprising one or more pixels 12. In this case the pixel 12 represents one or multiple pixels of the same column, and each pixel 12 is connected with an input of a column amplifier 14. A pixel reset line is also connected to a reset input of each of the column amplifiers 14. An N-bit counter 16 counts up clock signals that are supplied from a clock pulse generator 17, and the counter 16 supplies a digital count value on a counter output bus 18 that supplies an input of a DAC or digital-to-analog converter element 20. For simplicity, the same clock pulse generator 17 is used for both the counter/latches 24 and the DAC 20. The user may employ different clock pulse generators to add flexibility. The clock generators may have different frequencies, yet be operational at the same time. In this embodiment a low count value corresponds to a video dark or black value, while a high count value corresponds to white. The DAC 20 creates a ramp voltage output that steps up incrementally with each count, and then cycles or resets and generates another ramp. Not shown for simplicity is the reset signal to latch/counter elements. Each column has a comparator 22 with each comparator 22 having one input receiving the ramp signal AnalogRamp from the DAC and another input receiving the analog pixel value from the associated pixel amplifier 14. The comparator 22 changes state, e.g., from "0" to "1", as soon as the ramp signal level equals or exceeds the pixel voltage from the associated pixel amplifier 14. For each column there is a logic gate 23 with one input fed by the comparator 22 and one receiving clock pulses from the clock generator 17. Each column also has a column counter/latch circuit 24, which can constituted be a simple ripple counter or asynchronous counter, with a clock input coupled to the output of the logic gate 23. The column counter/latch circuits 24 each count up until the logic gates 23 input from the comparator 22 changes state, after which the clock signals are blocked by the logic gates and the column counter holds a value corresponding to the count on the N-bit counter 16 at the moment that the ramp voltage equals the pixel voltage. Then the count for each column is transferred as a digital pixel value, column by column, to a video readout bus. Column select switches 30 are gated one at a time in response to respective column select signals, so that the digital signal appearing on the readout bus 28 corresponds to the analog value of the video provided by the respective pixels. This digital video signal has numerous advantages as mentioned before over analog video processing.

The analog ramp is generated by counter 16 and N-bit DAC 20 and is compared to the video voltage from the pixel amplifiers throughout the entire array. Each comparator 22 makes the associated column counter/latch 24 transparent if the analog ramp voltage is below the pixel amplifier signal, so that when the analog ramp has passed the particular pixel amplifier voltage, the corresponding column counter/latch 24 holds the count value that was present when the ramp voltage was equal to the amplifier voltage. In this digitizing scheme conversion time of $2^N$ cycles is required, as compared to N cycles in a SAR-DAC. Glitch removal (to prevent latching when the counter is changing) is not shown in this diagram.

The comparator 22 can be a simple open loop operational amplifier, but preferably have a registered structure or hysteresis to avoid noise jitter on the output to accidentally latch the column counter/latches 24 during counter transitions which may cause erroneous conversion. Alternatively, the comparator functionality can be performed by a modification to the ACS buffer or to other amplifier structure. It is beyond the scope of this invention to present modern comparator structures that minimizes comparator offset errors (output transitions at a fixed voltage difference between the negative and positive inputs) or avoids output jitter (comparator output transitions when inputs are stable due to temporal or system noise). In this context, a comparator can be any means of comparing two voltages to produce a controlling signal. The pixel or column amplifier 14 is intended to reference any single pixel or column of pixels that provides a voltage or sequence of voltages corresponding to the amount of incoming light during the exposure time.

As mentioned before, the pixels 12 in the array can physically be one pixel or a column of pixels feeding the associated column amplifier 14 that converts the signal from the pixels to a voltage. The amplifiers 14 (or alternatively the pixels 12) can be reset to a black level, and sampled-and-held to maintain a constant output voltage independent of the incoming light. The comparators 20 compare the held voltage to the analog ramp voltage and their outputs controlling a respective one of the digital counters/latches 24. The comparator output is applied as a latch-enable, LE. If LE is low, the counter/latch 24 is transparent according to the implementation above. The counters/latches 24 can be sequentially read out after the conversion has been completed on a digital video bus by pulsing the Col_Select signals in the correct sequence.

Figure 2A:
FIGS. 2A to 2D are signal charts for explaining the operation of this embodiment.
Figure 2B:
Figure 2C:
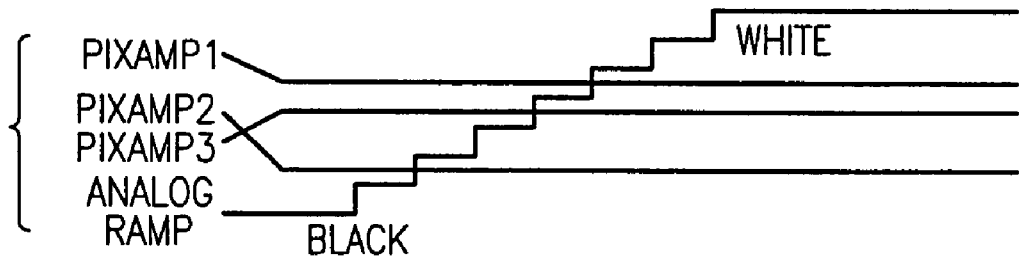
Figure 2D:
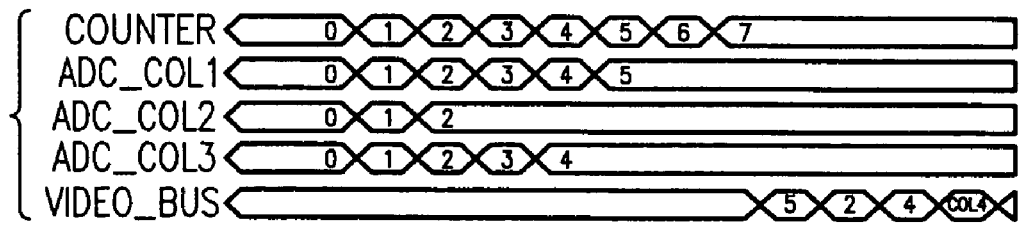
Figure 4C:
Figure 4C:
Figure 4C:
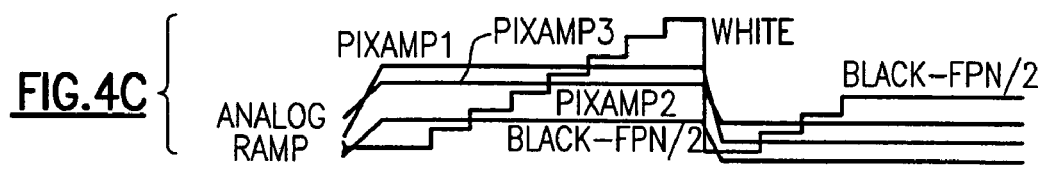
Figure 4E:
Figure 4E:
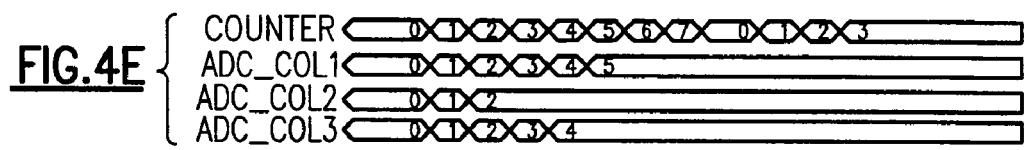

The operation of this arrangement can be explained in FIGS. 2A, 2B, 2C and 2D. These charts show schematically, and on a small scale, the operation of the imager 10, and the waveform diagrams shows an example of a 3bit ADC where three amplifier voltages "PixAmp" are sampled-and-held to maintain a constant voltage. A sample-and-hold signal (FIG. 2A) is applied to the pixel amplifiers 14. All the pixel amplifiers 14 across the array change during the time of that pulse to their new pixel value. Once the amplifier voltages are held, the counter starts counting from 0 to $2^N-1$ and the resulting ramp voltage (AnalogRamp—FIG. 2C) is compared to the held voltages throughout the array to latch the counter value. In the example above, three of the amplifiers output respective pixel voltages, namely PixAmp1, PixAmp2 and PixAmp3, as shown in FIG. 2C, and these digitize respectively: PixAmp1 digitizes to "5", PixAmp2 to "2" and PixAmp3 to "4". External gating (or timing), as shown in FIG. 4D, of the "LE" will determine if the counter value before or after the ramp has passed should be locked in and at the same time prevent glitches from skewing of a count that is in the process of changing (not shown). Once all $2^N$ cycles of the AD-Conversion has completed, the contents of the counters/latches can be sequentially read out on the resulting video bus (shown as Readout_Clock—FIG. 4B).

One of the major problems in image sensors is fixed pattern noise or FPN, which is due to fixed offset variations. According to another aspect of this invention, a scheme for reducing or eliminating FPN is presented here which re-utilizes the very same portions of the circuit for compensating for those offset variations. The amplifier voltages can be considered as a sum of the video signal, the black level and FPN. Where the video signal is dependent only on the light on the pixel, the black level is constant throughout the array, and FPN is the variation in offsets across the array. When the pixel is reset, the video signal gets removed from the sum that constitutes the pixel output. The black level plus offset at the time of reset can be subtracted from the respective pixel output to compensate for the offset and thus remove the FPN. This can be carried out digitally by taking the digital value of the pixel output and subtracting the digital value of the offset. The FPN is of far smaller dynamic range than the video signal, so if the AD-conversion is run again after the pixels or amplifiers have been reset, the FPN can be latched separately and digitally subtracted from the digitized video during read-out. The FPN digitizing can be carried out in a significantly smaller number of clock cycles. One of the major benefits to the lower dynamic range of the FPN is that the counter only has to make a ramp from black−FPN/2 to black+FPN/2 and therefore uses a small fraction of N bits, i.e., "M" in the diagram below, where M<<N.

Figure 3:
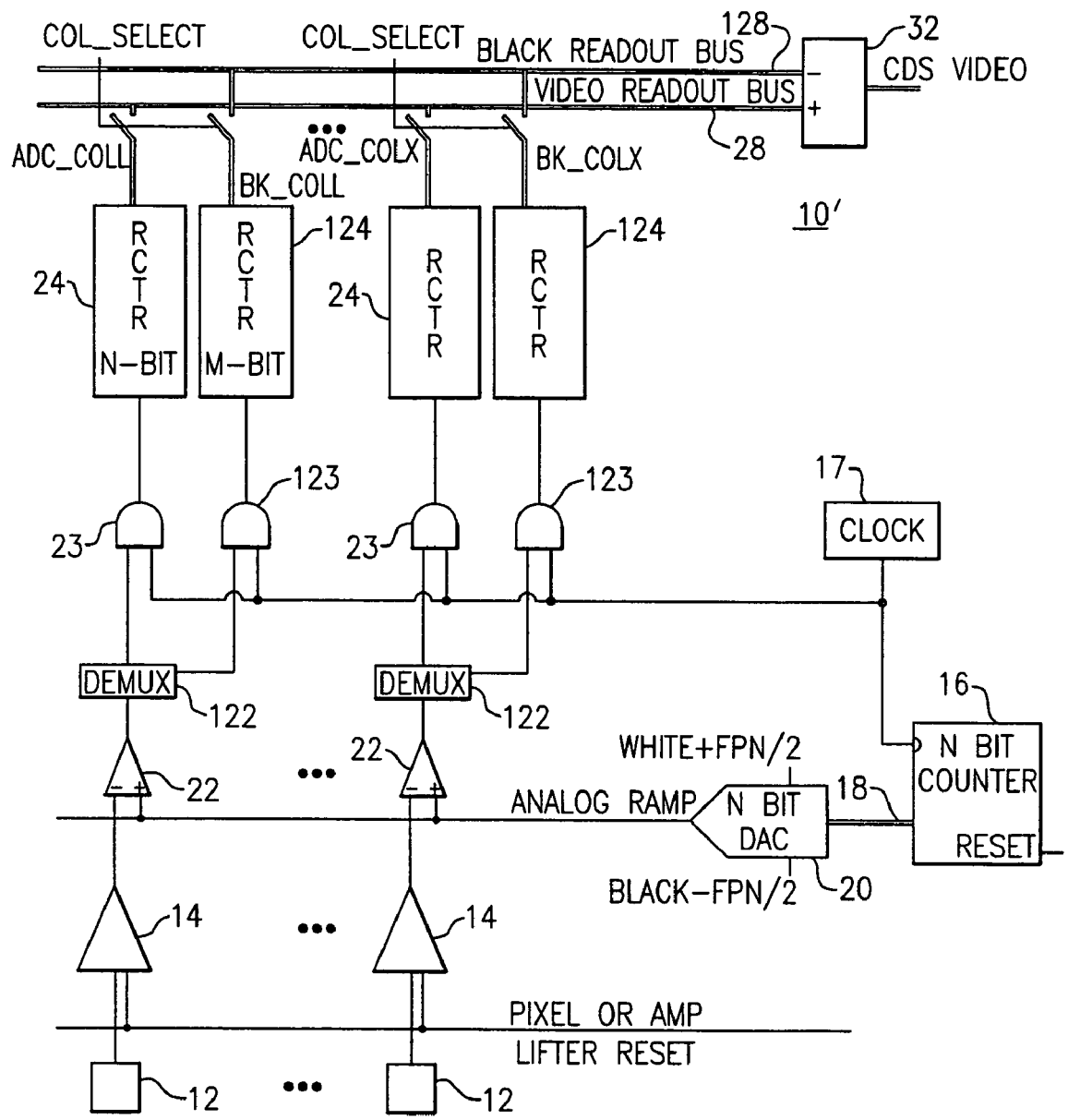
FIG. 3 is a schematic circuit diagram of another embodiment of this invention.

As shown in FIG. 3, an embodiment of the imager 10' is adapted for compensation for fixed pattern noise or FPN, and as with the previous embodiment employs an array of pixels 12, arranged in columns with associated pixel amplifiers 14, a clock pulse generator 17, an N-bit counter 16, a counter output bus 18, an N-bit DAC 20 which outputs an analog ramp, column comparators 22, logic gates 23, and video counter/latch elements 24, which perform as described in relation to the embodiment of FIG. 1. In addition, there is another set of counter/latch elements 124 and a second set of logic gates 123. The second counter/latch elements count and hold a value that corresponds to the contents of the N-bit counter 16 during reset. This value is a digital representation of the column pixel and pixel amplifier offset. To this end, there is a de-multiplexer 122 situated between the comparator 22 of each column and inputs of the logic gates 23 and 123, which supply clock pulses to the associated video counter/latch element 24, which is an N-bit latch, and to the associated offset counter/latch element 124, which may be a smaller, M-bit latch. The outputs of the counters/latches 24 are sequentially fed to the video readout bus 28, and those of the counters/latches 124 are fed to a black readout bus 128. These both lead to a digital subtraction element 32, which outputs an offset-corrected video or CDS digital video signal. Not shown for simplicity is the reset signal to latch/counter elements.

Figure 4F:
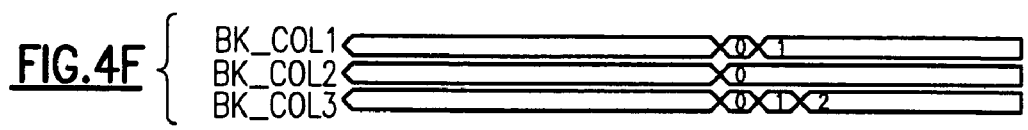
Figure 4G:
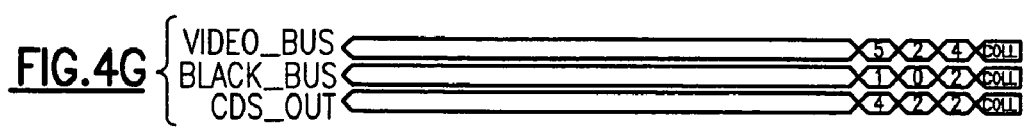

This embodiment, which employs this CDS scheme may be explained in the waveform diagrams of FIGS. 4A to 4G, where a 3bit video digitizing (FIG. 4C) is followed by a 2bit FPN digitizing. Sample-and-hold signal (FIG. 4A) and Readout_Clock signals (FIG. 4B) occur at the times shown, as described in connection with the first embodiment. The video outputs are subject to the clocked counter output COUNTER (FIG. 4E) and are gated on and off as indicated as digital values ADC_Col 1, ADC_Col2, and ADC_Col3. Once the video digitizing has completed, the pixels 12 (and/or pixel amplifiers 14 and/or latch/counters 24) are reset (FIG. 4D) to the [black level+FPN] (FIG. 4C) and those voltages compared with the AnalogRamp voltage, and are digitized into respective counter/latch elements 124, as indicated as digital values Blk_Col 1, Blk_Col2, and Blk_Col3 (FIG. 4F). The ADC_Colx and Blk_Colx are read out simultaneously and fed to the digital subtraction element 32 to remove the black_level+FPN from the video_signal+black_level+FPN and thus output only the pure video signal. Because only a reduced number of bits is needed in the black digitizing, very few clock cycles are added to the overall line time to achieve FPN reduction.

The CDS described is DS and not true CDS; true CDS requires the black level to be digitized before pixel exposure and stored until used for subtracting from the later digitized video signal. The digital latches, being noise free and consuming virtually no power, constitute excellent memory cells and provide a linear sensor method of resetting the pixels while digitizing and storing the black level. Then pixel exposure can be carried out, holding the amplifier output. The amplifier output is subsequently digitized and combined with the previously stored black values. This subtracts the black level and offset from each corresponding digitized video level, to yield a true CDS solution. In previous area sensors the black levels have had to be stored for the entire array and not just a line at a time. But here, since the black levels are already in digital form, true CDS can be implemented using a memory array for storing of only M-bits per pixel during pixel reset.

Figure 5:
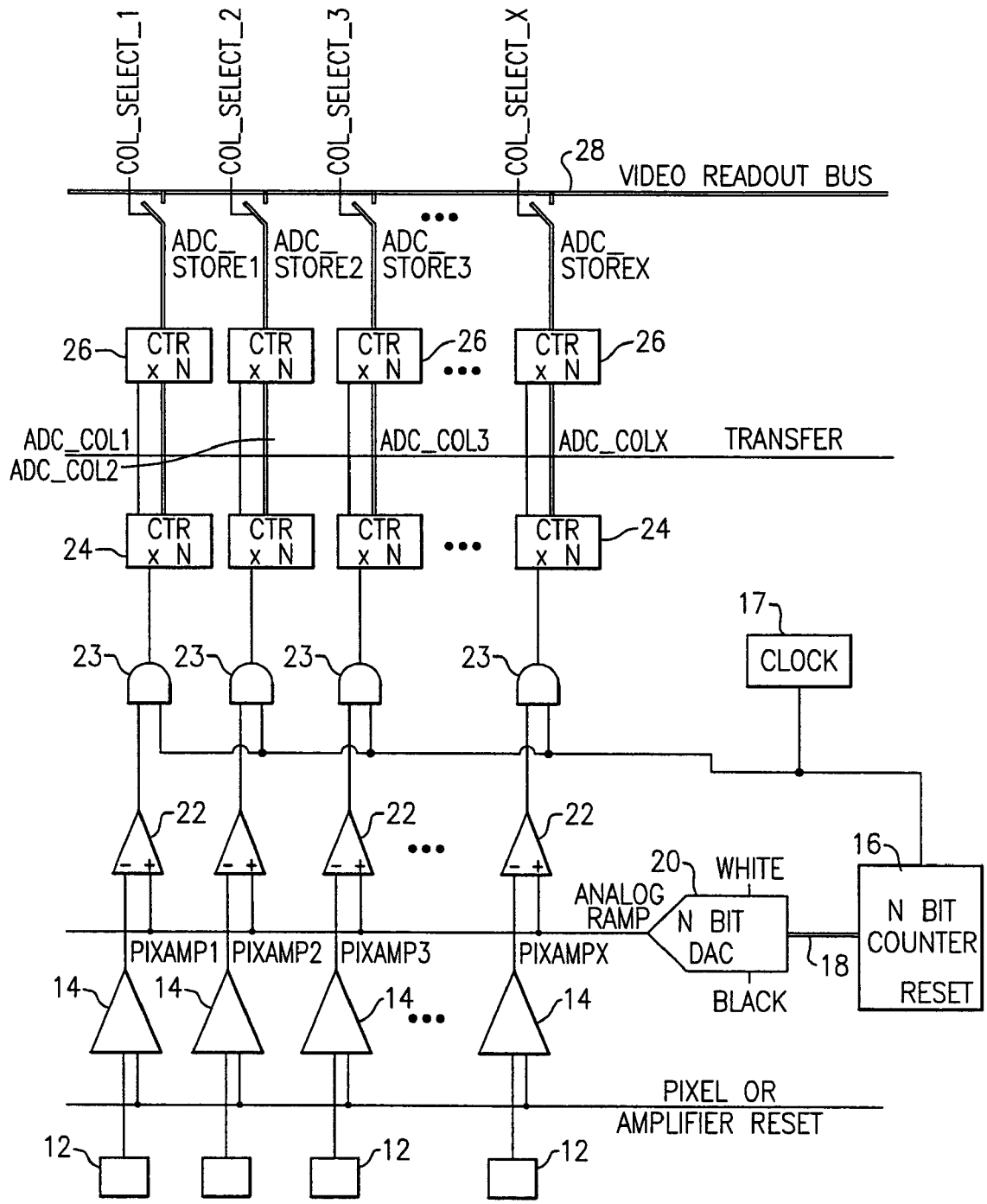
FIG. 5 is a schematic circuit diagram of a another embodiment of this invention.

Another embodiment is illustrated in FIG. 5, in which a second layer of latching hides the conversion time of $2^N$ clock cycles. The same elements that are present here as in the previous embodiments are identified with the same reference numbers, and a description of those elements can be omitted. A set of second level counters/latches 26 is introduced here to pipeline the video level counters/latches 24 at the end of a conversion cycle. Here, the second counters/latches 26 are latched in response to a transfer update signal Transfer. In other words, the first layer digital video counters/latches 24 can convert the video levels during the above-described conversion time ($2^N$ clock cycles) simultaneously with the readout of converted video levels from the previous row or line is being readout, i.e., from the second level counters/latches 26. This enables the $2^N$ clock cycle conversion time to be hidden during readout and the line-overhead time (i.e. the time slot between reading out the last pixel in one row to the first pixel in the next) can be greatly minimized or even made negligible.

Figure 6C:
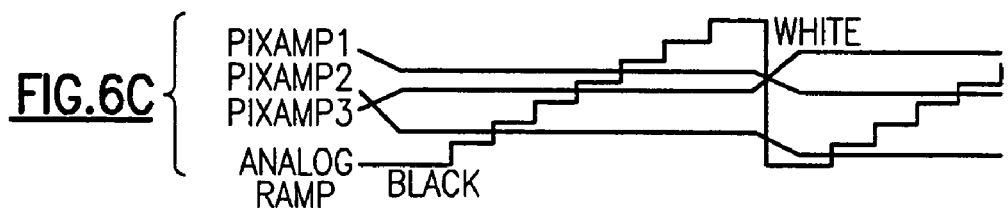
Figure 6D:
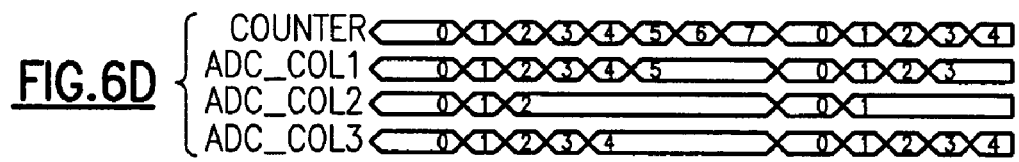
Figure 6F:
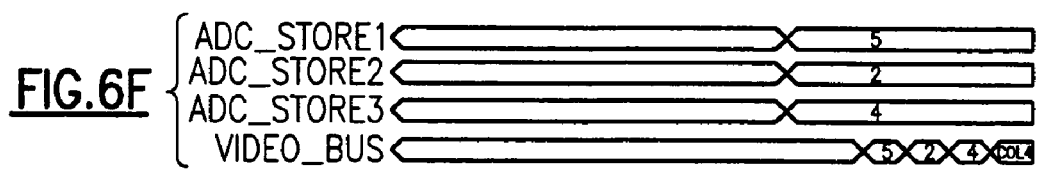

With this embodiment the Sample-and-Hold signal (FIG. 6A), Readout_Clock (FIG. 6B), PixelAmp1, -2, -3, and AnalogRamp signals (FIG. 6C), Counter and ADC_Col1, -2, and -3 (FIG. 6D) appear as in the FIG. 1 and FIG. 2 embodiment. After the first conversion line or field of video is converted, the transfer signal (Transfer—FIG. 6E) occurs to actuate the counters/latches 26 and transfer to the counters/latches 26 the contents of the video level counters/latches 24, which all contain the A/D converted digital levels corresponding to all the pixels 12 or column amplifiers 14. The second level counters/latches 26 are sequentially selected onto the video level bus 28 during the same time when the next video line or field is converted (FIG. 6C). That is, while the next row of pixels 12 or column amplifier 14 voltages are being converted, the previous line of digital values ADC_Store1, ADC_Store2, ADC_Store3 are transferred to Video_Bus (FIG. 6F).

If an N-bit DAC is used as a ramp generator it will be possible to run the associated counter in increments of 2Y and get an bit ADC that converts in clock cycles. For instance if a 16-bit DAC is used as a ramp generator, 16-bit digitizing of every pixel in 64K clock cycles is done by counting in increments of 1. If the counter increments by $2^8$ (0, 256, 512 . . . ), 8-bit digitizing of every pixel in 256 clock cycles can be done with the same hardware. Counting by increments of $2^4$ (0, 16, 32 . . . ) will give get 12-bit digitizing in 4K clock cycles. This scheme makes one device flexible enough to digitize fast with low resolution and slow with high resolution.

Figure 13:
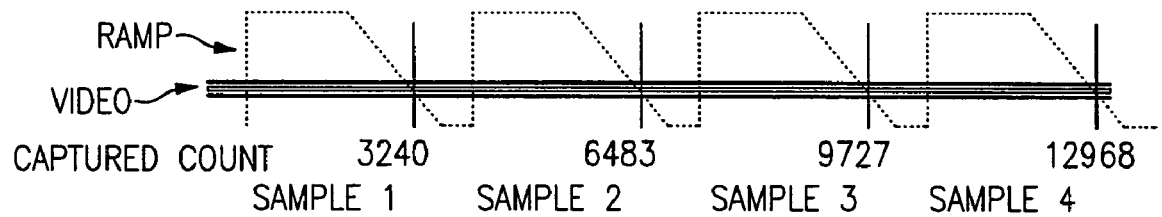
FIG. 13 is a signal diagram showing capture of the count over a number of samples.

FIG. 13 is a chart showing the overlay of the DAC ramp and the sampled video level signals, illustrated to show the effect of cumulative captured counts for successive sample periods of the same video value, i.e., oversampling. In this example, the same video value, i.e., pixel value is sampled four times. The ramp generated from the DAC 20, as previously described, generates a count in the counter/latch 24 each time the ramp crosses the level of the video signal which is here represented as the horizontal line. The counter/latch is not reset, but resumes each time to produce a cumulative count. As shown, at the first sample, this video level produces a count of 3240 for sample 1, and then at samples 2, 3, and 4, the cumulative count is 6483, 9727, and 12968. Here, the counter 24 is a fourteen-bit ripple counter, and by dropping the two least significant bit and employing only the top twelve bits, the value is read out directly as a count of 3242, i.e., in effect a divide-by-four operation. On the other hand, for extremely low light level operation, the cumulative total of the four samples can be read out by using the lower twelve bits, and disregarding the upper two.

Figure 7:
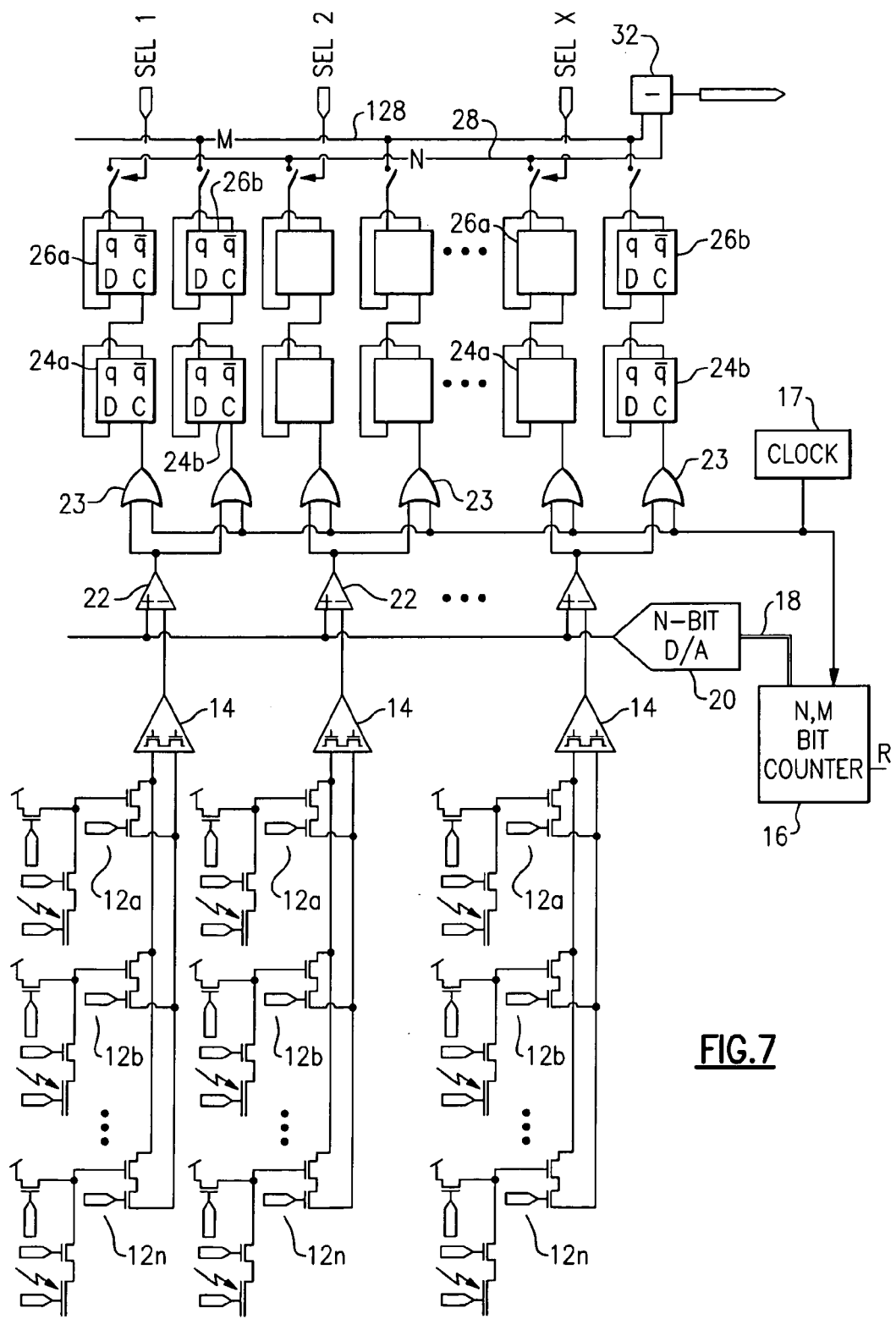
FIG. 7 is a circuit diagram of a of another embodiment.

FIG. 7 is a preferred embodiment according to this invention for an area sensor, where features of both the FIG. 3 and FIG. 5 embodiments are incorporated. The elements that are in common with the previous embodiments are identified with the same reference numbers and a detailed description of those elements is omitted. There are both video level counter/latches 24a and black level counter/latches 24b as well as second-level counter/latches 26a and 26b, to pipeline the conversion stage and allow both temporal and offset compensation conversion while reading out the black and video levels from the previous row. The conversion time for this preferred embodiment is $2^N+2^M$ clock cycles, but this time is hidden behind the second level counter/latches and is simultaneous with the readout time. Here, for sake of simplicity, this view shows a single DFF to represent an entire set of flip-flops that would constitute the counter 24a, 24b, 26a or 26b. Here, in each column are pixels 12a, 12b, * * * 12n with the pixels being in different successive rows. The latch/counters 24a and 24b are capable of summing multiple samples in the same row, as well as summing up pixel values in different rows.

The counters 26a, 26b of FIG. 7 can be employed to sum up multiple samples of the same row or different rows. This is accomplished by keeping the counter value from a currently selected row, e.g., the row with pixels 12a, and selecting the next row, e.g., the row with pixels 12b, and then re-sampling.

Figure 8:
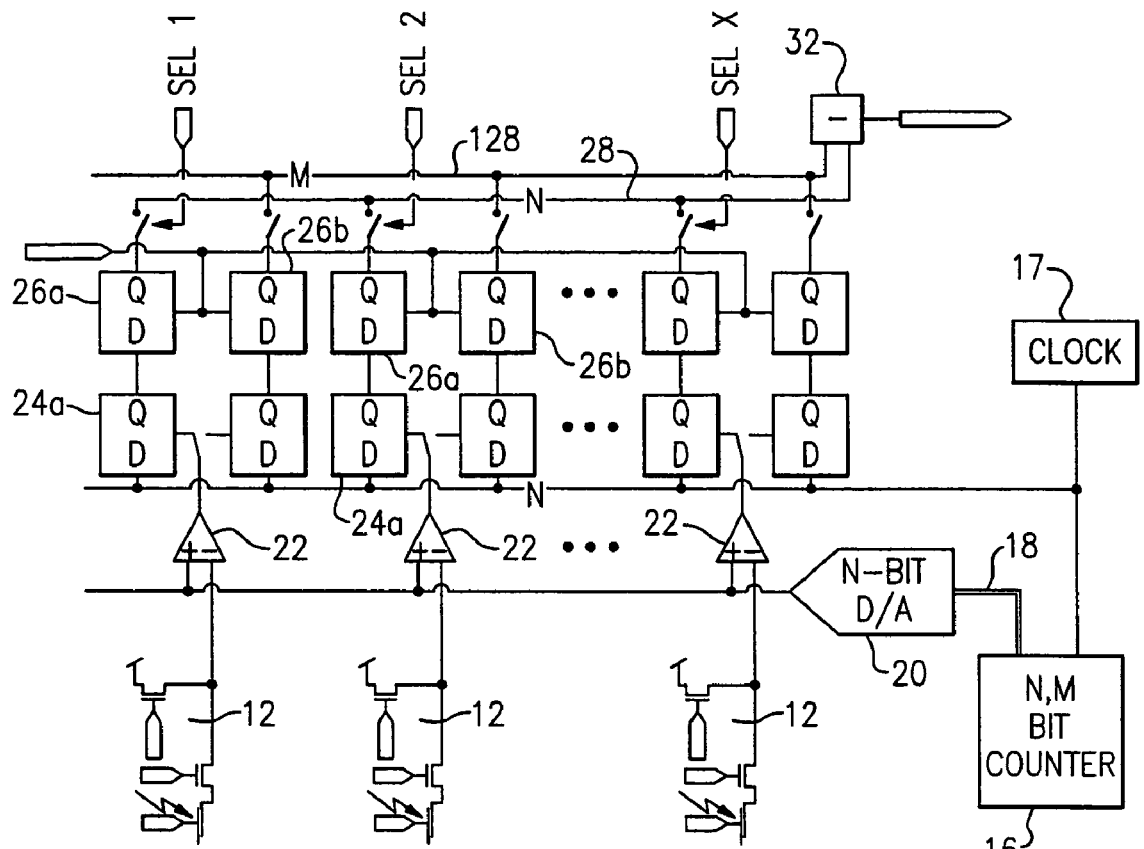
FIG. 8 is a diagram of an linear imager of this embodiment.

FIG. 8 is another embodiment according to this invention, here shown for a linear sensor, where the sense nodes from selected rows of the pixels 12a to 12n are applied directly to the inputs of the comparators 22, i.e., the inputs are identical to the comparator input signals. This configuration reduces the amount of circuitry and power consumption. In this embodiment, the column amplifiers 14 are absent. The remaining elements are as identified in the previous embodiments.

Figure 9:
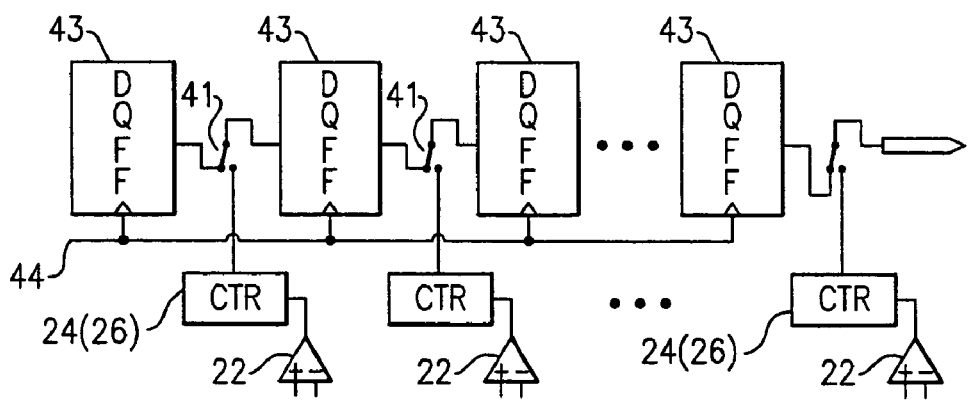
FIG. 9 is a diagram of another embodiment.

FIG. 9 is an alternative implementation of a digital readout structure, where sequential select signals are omitted and replaced by a column-wide-signal similar to the update signal Transfer controlling a selector switch 41. The black and/or video level ripple counter latches (both represented by a single counter/latch 42) are read into a set of DQ flip-flops 43, either static or dynamic, and the black/video levels are shifted from one DQFF 43 to the next using the readout clock signal 44. The advantage of this technique is that there are no wide digital busses to multiplex and thus the readout speed can thus be much higher.

Digital post-processing algorithms can be employed to achieve a higher bit resolution in some picture areas of interest and a lower resolution in the areas of less interest. This same benefit can be accomplished with the circuitry of this invention, where the counter is incrementing by one step at a time within some range of certain count values, the count increment is doubled in another range of count values, and increment is doubled again in some other range of count values, and so on. This gives the digitized values a resolution of for instance 16 bits near black, 15 bits at dark, 12 bits at gray and 8 bits at white with a resulting conversion time being much lower than 64K clock cycles. For high N and M values, the conversion time can become long. This time can be greatly reduced by reducing the resolution for portions of the image where high resolution is unimportant. The higher resolution areas can be in the gray areas, dark areas, or bright areas, depending upon the particular application.

Figure 9A:
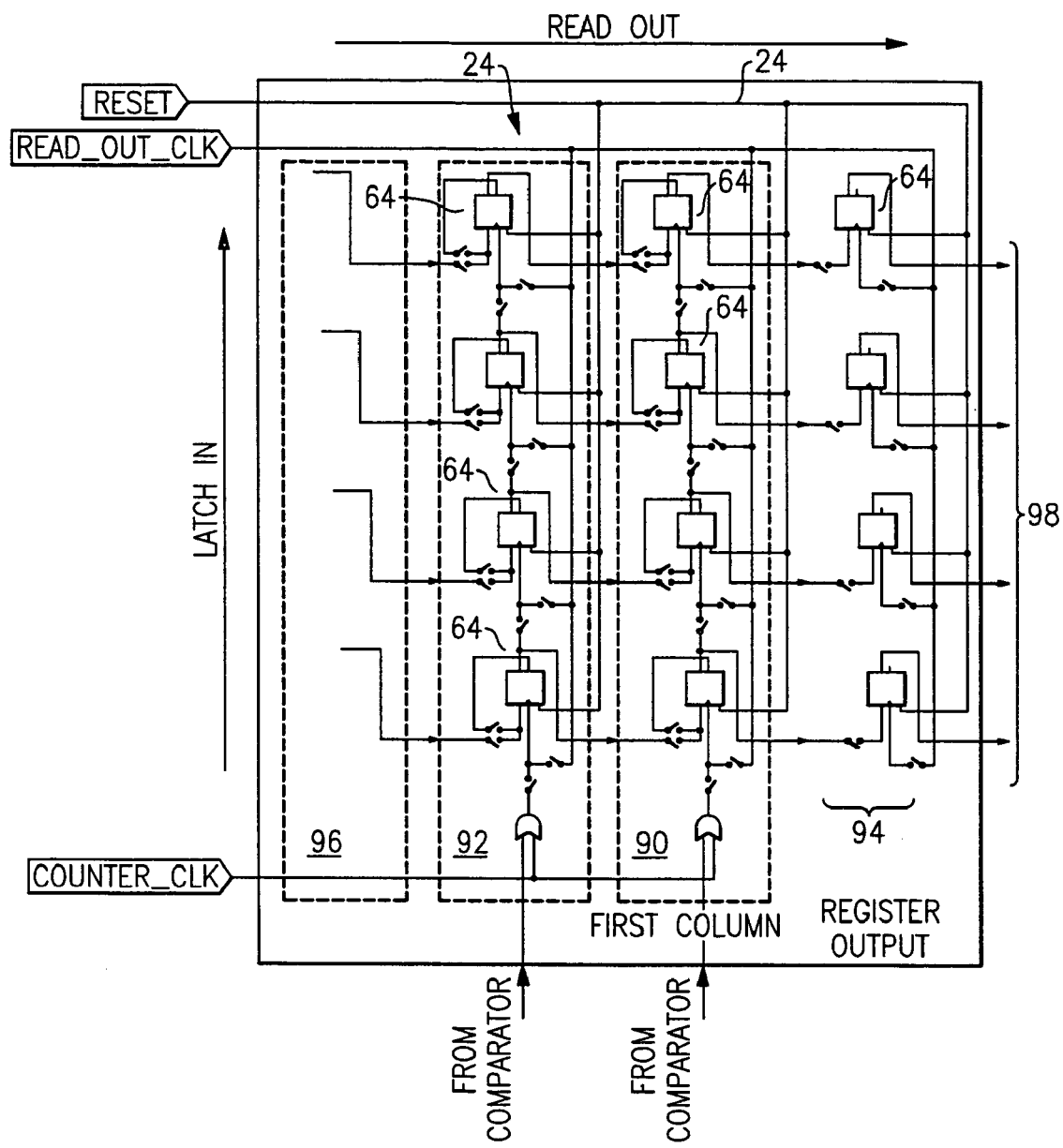
FIGS. 9A and 9B are schematic diagrams for explaining the operation of the counter/latch elements.
Figure 9B:
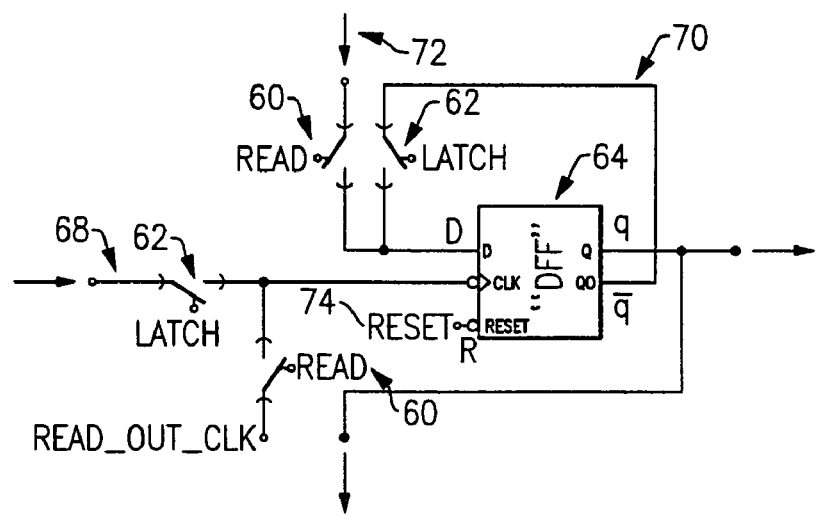

FIG. 9A illustrates the architecture for configuring a D flip-flop array as ripple counters 24 to be used during a pixel sampling phase and then reconfiguring them, electronically, as shift-registers to clock out the stored data in sequence. Reference is also made to FIG. 9B, showing detail of one DFF counter latch bit used as shift register, and to FIG. 9D, formed of FIGS. 9D-1 to 9D-9, for explaining timing of the counter/latch used initially as counter and then reconfigured as shift register.

In FIG. 9A, the D flip-flops 64 are connected to be used for binary counters, i.e., ripple counters. Here the counters 24 are shown as four-bit counters, for purposes of illustration, but in a practical embodiment these could have any desired number of bits. Here there are two column circuits shown, columns 90 and 92. The remaining columns, not shown, would be of similar construction. Also shown here is an optional set of extra latches 94, which may be included or omitted, depending upon application. All the counter/latches are formed of D-type flip flops, and have the same circuit loading. The number of bits employed in the counter, the counter configuration, and the control logic can be varied as desired, and the techniques and options for such would be available to persons skilled in this art. The counters 24 count clock pulses during the ramp period sample time. With further reference to FIG. 9B, the D flip flop 64, when used as a counter bit, has a feedback connection from the $\bar{q}$ or q-inverse output 70 to the D input, and an input clock node 68, that is, from the DAC counter clock or the previous bit q output, as shown in FIGS. 9A and 9B. To be configured as a counter bit node as shown in FIG. 9B, nodes 68 and 70 have the Latch control signal 62 enabled to provide continuity, and have the Read signal 60 disabled. When the D flip-flop 64 is configured a shift register to clock out the latched count values, the Latch signal 62 is disabled and the Read signal 60 is enabled. This connects adjacent columns along each bit level.

As seen in FIG. 9B, the adjacent column bit on node 72, for example, latches in the count from column n−1 and feeds the registers of column n. Column n+1 in turn drives node 72 to column n+2 when used as a shift register. The D flip flops 64 are reset to begin a new cycle, or clear the latched values at the appropriate times, using the reset control node 74.

Figure 10:
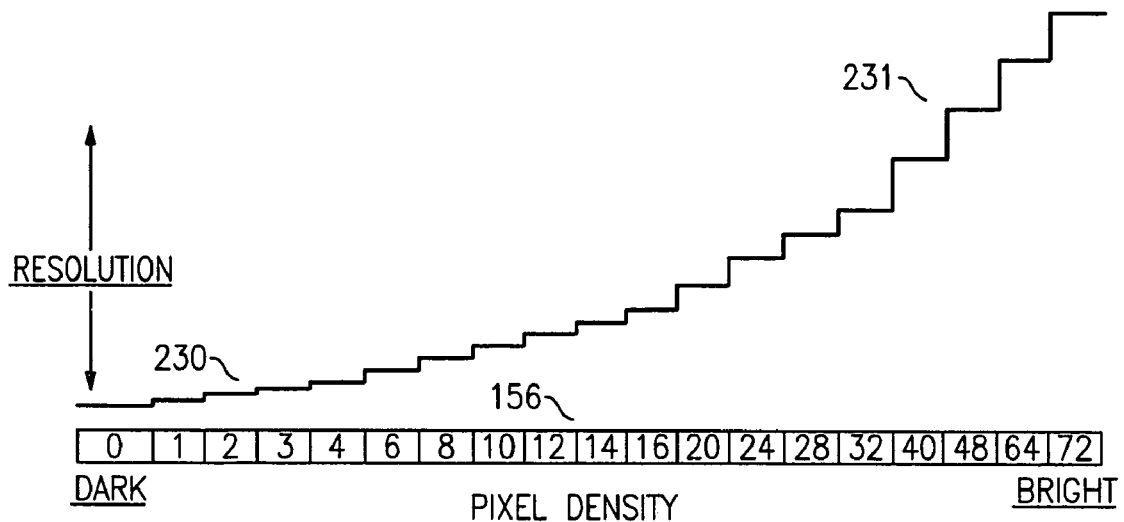

FIGS. 9C-1 to 9C-10 show the timing of the arrangement of FIG. 9A. The timing of the counter/latch circuit 24 is explained beginning at FIG. 9C-1 and 9C-2, which show timing of the comparator 22 outputs, indicating when the comparator outputs for the first and second columns change state. FIG. 9C-3 shows the latch control signal LATCH which changes state after the column counter/latch elements 90 and 92 have accumulated their count values. FIG. 9C-4 shows the clock pulse timing of the clock signal COUNTER_CLK, and FIGS. 9C-5 and 9C-6 show the accumulation of the counts in the column counter/latch elements 90 and 92. FIG. 9C-7 shows the timing of the read-out clock pulse signal READ_OUT_CLK; FIG. 9C-8 shows the timing of the read control signal READ; and FIG. 9C-9 shows the timing of the transfer of the pixel values of columns 90 and 92 when the counter/latch 24 is used as shift register. Finally, FIG. 9C-10 shows timing of the reset signal RESET.

In the example as shown here, the timing starts out by resetting the counter latches when the reset signal RESET goes low. To count up, the latch signal LATCH is high and the read signal READ is low. Then the column counter/latches count the DAC counter clock signal COUNTER_CLK and when the comparator signals go high (FIGS. 9C-2 and 9C-3), the count is captured for each column. The first column 90 latches a final count of 03 (hexadecimal) and the second column 92 latches a final count of A (hexadecimal). The counter/latches are reconfigured as shift registers by enabling the read control signal READ and disabling the latch control signal LATCH. The next read clock signals READ_OUT_CLK then shift the counts of the columns 90 and 92 down the line to the output of the register output bus 98. First the value 03 is shifted, and the subsequent read clock pulse READ_OUT_CLK shifts the value A to the output bus 98.

FIG. 10 illustrates a technique for shortening the conversion time, in which the counter 16 can be made to count in incremented steps causing the bit resolution to be highest near black (e.g. 16-bits) and reduce as the pixel converted gets brighter (e.g. 10-bits). Conversion is linear, but the result is a digital video with intentional missing codes at brighter pixels. This embodiment is preferable in cases where the video is subjected to a subsequent gain stage (white balance, color convolution or other) or gamma lookup table (optional black-level sampling for CDS is not shown).

Figure 11:
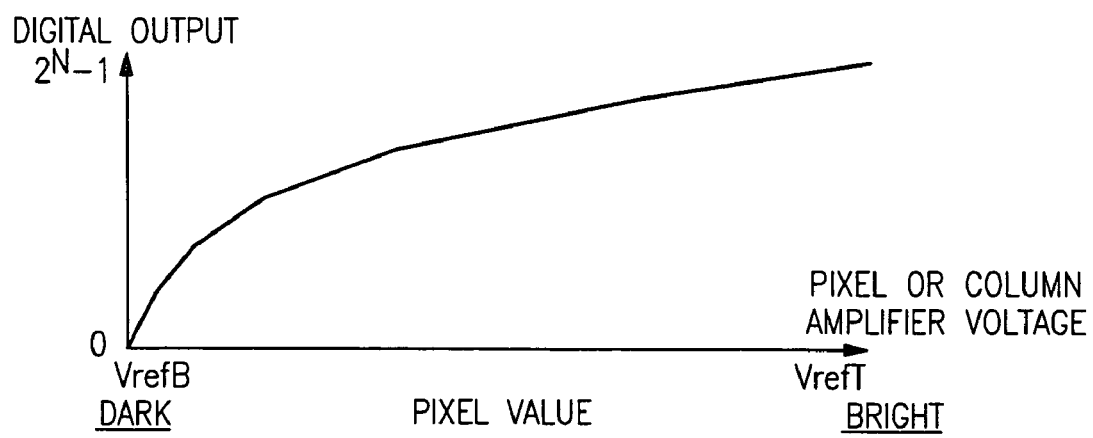

FIG. 11 illustrates another alternative technique and shows the output of the ADC per column when the DAC 20 has exponential voltage output while the counter 16 provides a linear count. The result is a digital video output that is gamma-corrected. Other embodiments with non-linear counter to DAC relationships are also possible in the present invention.

Figure 12:
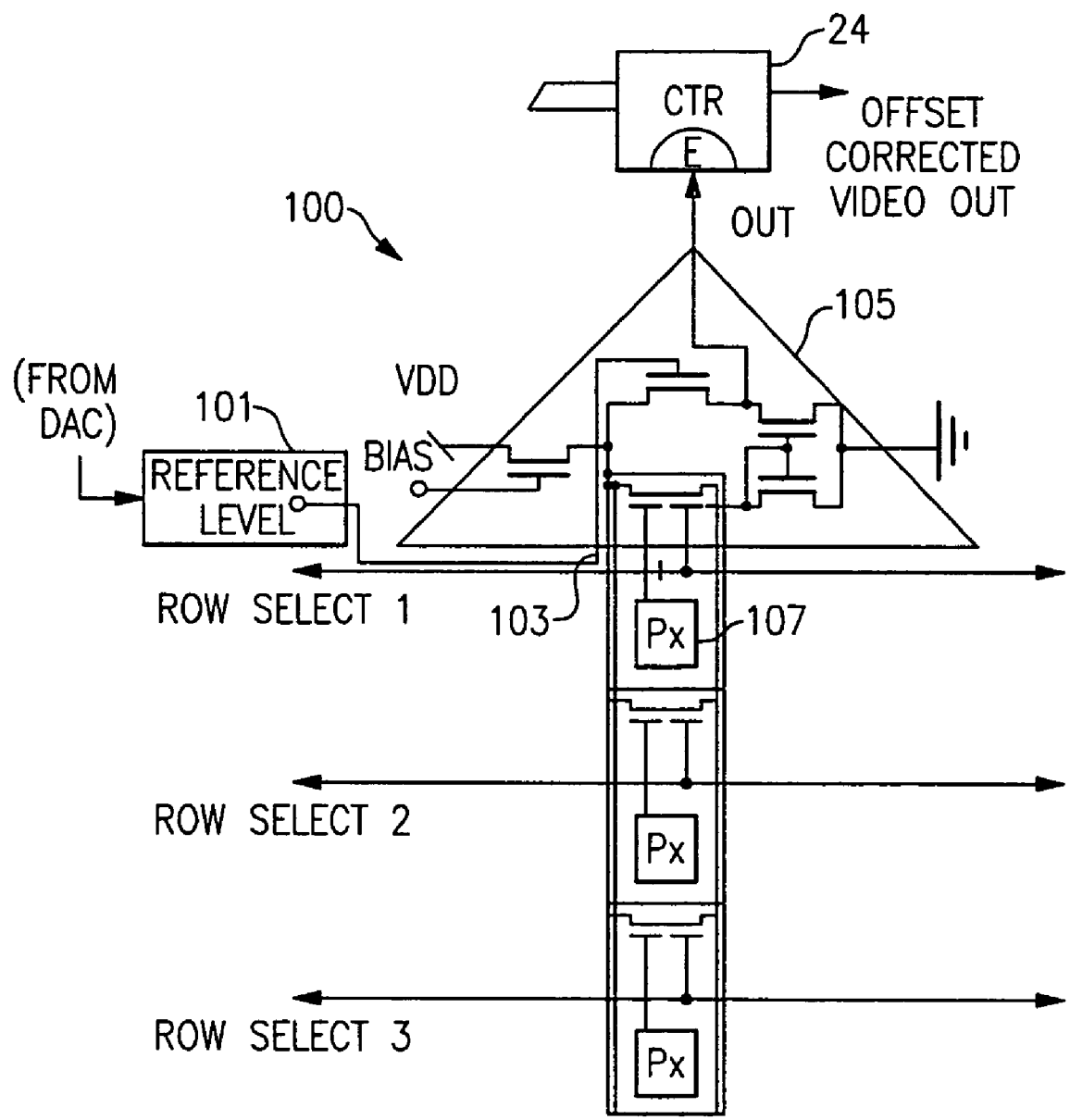
FIG. 12 illustrates an embodiment of this invention in which an active column sensor is reconfigured as comparator.

Referring to FIG. 12, another particular embodiment employs an active column sensor device 100 (as detailed in U.S. Pat. No. 6,084,229) which is reconfigured to serve as a comparator with respect to a reference level source 101. In this embodiment the feedback path for the active column sensor (e.g., as explained in respect to FIG. 2 of U.S. Pat. No. 6,084,229) is removed and the reference signal or reference level source 101 is coupled to one of the inputs 103 of an associated operational amplifier 105. The output of the operational amplifier 105 controls the associated latch/counter 24. The remainder of the active column sensor 100, such as the internal components and operation of the amplifier 105 and the pixels 107, by way of example only, are the same as described in U.S. Pat. No. 6,084,229, which is incorporated herein by reference and need not be described here. When an input or collected signal is received from the pixel 107, the active column sensor is reconfigured to be compared to a reference signal provided by the reference level source 101. The difference between the two input signals is amplified by the open loop gain of the amplifier 105, causing the output to slew to the most positive or most negative limits of the amplifier 105. A comparator is often used as the first stage in some analog-to-digital converter architectures. Although in the particular embodiment the output reconfiguration circuit is a reference level source 101, other types of output reconfiguration circuits may also be used, such as an integrator circuit or circuit with gain, by way of example only. The ramp AnalogRamp from the DAC 20 would serve as the reference level for the reference level source 101.

With many types of digital post-processing algorithms (e.g. digital gain and gamma correction) it is advantageous to have a higher bit resolution near black and lower bit resolution near white. This can be accomplished with the same hardware as described in the previous paragraph where the counter is incrementing by 1 up to a certain count value where the count increment is doubled until a next count where the increment is doubled again and so on. This makes the digitized values have a resolution of for instance 16-bits near black, 15-bits at dark, 12-bits at gray and 8-bits at white with a resulting conversion time being much lower than 64K clock cycles.

Other ways to speed up read-out can employ multiple parallel video busses: One implementation could use one digital video bus for all odd pixels and one for all even pixels. Another could use one bus for pixels 1 to Y, one for Y+1 to 2*Y, and so on. Then, the digital values can be multiplexed onto one single video stream just before sending it off chip.

A significant advantage of a working with the video signals in digital form is that the busses can be separated by a latch or flip/flop to pipeline the video signal and thus decrease the readout time to the time it takes to charge only one level of the bus.

While this invention has been described in connection with selected preferred embodiments, it should be apparent that the invention is not limited only to those embodiments, but that many variations and equivalents would present themselves to those skilled in the art, and would not depart from the scope and spirit of this invention, as defined in the appended claims.

We claim:

1. Arrangement for converting analog pixel values from an array of pixels to a digital video signal, said array comprising a plurality of columns and at least one row, each column having at one pixel therein, and each column providing a respective pixel value; the arrangement comprising
   a source of clock signals;
   an N-bit counter coupled to said source of clock signals;
   an N-bit DAC connected to said counter and having a ramp output providing a signal corresponding to a count existing on said counter;
   a plurality of digital counter/latch elements each associated with a respective one of said columns and each also coupled to said source of clock signals;
   a plurality of comparators each associated with a respective one of said columns, and having one input connected to receive the respective column pixel value, another input connected to the ramp output of said N-bit counter, and a comparator output connected to a gating terminal of the respective digital counter/latch element;
   a video readout bus; and
   means selectively transferring contents of said digital counter/latch elements to said video output bus to produce said digital video signal.

2. Arrangement of claim 1 wherein each said digital counter/latch element includes a ripple counter.

3. Arrangement of claim 1 further comprising a plurality of black-level readout counter/latch elements, each associated with a respective one of said columns; each black level readout counter/latch element having an input connected to said source of clock signals and a gating element connected to the respective comparator output; a black-level readout bus; means for transferring the contents of the respective black-level counter/latch elements to the black-level readout bus simultaneously with the transfer of the contents of the associated digital counter/latch elements to said video readout bus; and a subtraction element connected to the video readout bus and the black-level readout bus.

4. Arrangement of claim 1 wherein said digital counter/latch elements each include a first ripple counter member having an input element coupled to said source of clock signals and said comparator, and a buffer latch/counter member having an input connected to an output of the respective first ripple counter member, a gate terminal, and an output connected to the video readout bus; and means providing a transfer signal to the gate terminals of said buffer counter/latch members.

5. Arrangement of claim 1, wherein said video readout bus comprises a sequence of DQ flip-flops.

6. Arrangement of claim 1, wherein said source of clock signals provides clock signals at different frequencies for the N-bit counter and for the counter/latch elements, respectively.

7. Arrangement for converting analog pixel values from an array of pixels to a digital video signal, said array comprising a plurality of columns and at least one row, each column having at one pixel therein, and each column providing a respective pixel value; the arrangement comprising an N-bit counter; an N-bit DAC connected to said counter and having a ramp output providing a signal corresponding to a count existing on said counter; a plurality of digital latch/counter elements each associated with a respective one of said columns; a plurality of comparators each associated with a respective one of said columns, said latch/counter elements having an input elements to receive clock pulses and also being coupled to the associated comparator; wherein each comparator is made up of a differential-input amplifier, each of the amplifiers having a plurality of at least the first input transistor(s), one of the first input transistors located at each of the pixels with in the periphery, and a second input transistor located outside the periphery of the array and coupled to the first input transistors and to an output configuration circuit, and having one input connected to receive the respective column pixel value, another input connected to the ramp output of said N-bit DAC, and a comparator output connected to a gating terminal of the respective digital latch/counter element; a video readout bus; and means selectively transferring contents of said digital latch/counter elements to said video output bus to produce said digital video signal.

8. Arrangement of claim 7 wherein each said digital latch/counter element includes a ripple counter.

9. Arrangement of claim 7 further comprising a plurality of black-level readout latch/counter elements, each associated with a respective one of said columns; each black level readout latch/counter element having a clock input element connected to receive clocking pulses with a gating terminal connected to the respective comparator output; a black-level readout bus; means for transferring the contents of the respective black-level latch/counter elements to the black-level readout bus simultaneously with the transfer of the contents of the associated digital latch/counter elements to said video readout bus; and a subtraction element connected to the video readout bus and the black-level readout bus.

10. Arrangement of claim 7 wherein said digital storage elements each include a first latch/counter member having a clock input, and a buffer latch/counter member, having an input connected to an output of the respective first latch/counter member, a gate terminal, and an output connected to the video readout bus; and means providing a transfer signal to the gate terminals of said buffer latch/counter members.

11. Arrangement of claim 7, wherein said video readout bus comprises a sequence of DQ flip-flops.

12. Arrangement of claim 7, further comprising clock generator means providing clocking pulses at different respective clock frequencies to said N-bit counter and to said latch counter elements.

13. Arrangement for converting analog pixel values from an array of pixels to a digital video signal, said array comprising a plurality of columns and at least one row, each column having at one pixel therein, and each column providing a respective pixel value; the arrangement comprising
   a source of clock signals;
   an N-bit counter coupled to said source of clock signals;
   an N-bit DAC connected to said counter and having a ramp output providing a signal corresponding to a count existing on said counter;
   a plurality of digital counter/latch elements each associated with a respective one of said columns and each also coupled to said source of clock signals;
   a plurality of comparators each associated with a respective one of said columns, and having one input connected to receive the respective column pixel value, another input connected to the ramp output of said N-bit counter, and a comparator output connected to a gating terminal of the respective digital counter/latch element; and
   wherein each said digital counter/latch element is formed of a plurality of flip-flops including control inputs to receive a LATCH signal and a READ OUT signal, respectively, such that when said LATCH signal is applied the digital counter/latch elements count said clock signals to store a value corresponding to the respective pixel value, and when said READ OUT signal is applied said digital counter/latch elements are configured as a shift register and serve as means sequentially transferring contents of said digital counter/latch elements to a video output bus to produce said digital video signal.

14. The arrangement of claim 13, wherein said source of clock signals provides said clock signals at different frequencies to said N-bit counter and to said counter/latch elements, respectively.

15. The arrangement of claim 13, wherein said N-bit DAC provides ramps of different slope for different rows of pixels of said array.

* * * * *